(12) United States Patent
Kajiyama et al.

(10) Patent No.: US 10,573,708 B2
(45) Date of Patent: Feb. 25, 2020

(54) DISPLAY DEVICE

(71) Applicant: Japan Display Inc., Minato-ku (JP)

(72) Inventors: Kenta Kajiyama, Minato-ku (JP); Yusuke Goto, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/354,821

(22) Filed: Mar. 15, 2019

(65) Prior Publication Data

US 2019/0214451 A1 Jul. 11, 2019

Related U.S. Application Data

(63) Continuation of application No. 15/667,741, filed on Aug. 3, 2017, now Pat. No. 10,276,647.

(30) Foreign Application Priority Data

Sep. 8, 2016 (JP) .................................. 2016-175468

(51) Int. Cl.
| | | |
|---|---|---|
| *H01L 27/32* | (2006.01) | |
| *H01L 51/52* | (2006.01) | |
| *H01L 51/00* | (2006.01) | |
| *H01L 27/02* | (2006.01) | |
| *H01L 27/146* | (2006.01) | |

(52) U.S. Cl.
CPC ...... *H01L 27/3276* (2013.01); *H01L 27/0248* (2013.01); *H01L 27/3258* (2013.01); *H01L 51/5253* (2013.01); *H01L 27/14609* (2013.01); *H01L 51/0097* (2013.01); *H01L 51/5296* (2013.01); *H01L 2251/5338* (2013.01)

(58) Field of Classification Search
None
See application file for complete search history.

(56) References Cited

U.S. PATENT DOCUMENTS

| | | | |
|---|---|---|---|
| 9,806,284 B2 * | 10/2017 | Goto | H01L 51/5246 |
| 2016/0118616 A1 * | 4/2016 | Hiroki | H01L 51/0097 257/40 |
| 2018/0047938 A1 * | 2/2018 | Kishimoto | H01L 27/323 |
| 2018/0074553 A1 * | 3/2018 | Yamazaki | G09F 9/00 |

FOREIGN PATENT DOCUMENTS

| | | | |
|---|---|---|---|
| JP | 11-258621 | * | 9/1999 |
| JP | 2016-031499 | * | 3/2016 |

* cited by examiner

*Primary Examiner* — Ashok Patel
(74) *Attorney, Agent, or Firm* — Oblon, McClelland, Maier & Neustadt, L.L.P.

(57) ABSTRACT

A display device according to an embodiment of the present invention includes: a display panel including a display region, a backside region, and a curvature region, wherein the display panel comprises: an insulating base material disposed on the display region, the curvature region, and the backside region; a wiring layer that is disposed on an outer surface side of the insulating base material, and comprises an insulating layer and a wiring; a display element that is provided on an outer surface side of the wiring layer in the display region, and is electrically connected to the wiring; and a first protection sheet that is provided on an inner surface side of the insulating base material in the display region, and includes a plurality of projection parts that protrude toward a side of the curvature region from a side of the display region.

5 Claims, 6 Drawing Sheets

DISPLAY DEVICE

CROSS-REFERENCE TO RELATED APPLICATION

The present application is a continuation of U.S. application Ser. No. 15/667,741 filed Aug. 3, 2017, and claims priority from Japanese Application JP2016-175468 filed on Sep. 8, 2016, the content of each of which is hereby incorporated by reference into this application.

BACKGROUND OF THE INVENTION

1. Field of the Invention

One or more embodiments of the present invention relates to a display device.

2. Description of the Related Art

Recent years, in order to downsize a display device or to expand a display region on which an image is displayed, it is requested to narrow what is called a frame region that is around the display region (narrowing a frame). Especially, with respect to a mobile device such as a smartphone, a request for narrowing a frame is getting bigger.

As an example of a configuration to narrow a frame, Japanese Patent Application Laid-Open No. 2016-031499 discloses a display device including a film-like base material having flexibility, a display element provided on the base material, and a wiring connected to the display element. The display device includes a curvature part and a non-curvature part, and the wiring is provided so as to range over the non-curvature part and the curvature part. Like this, it is tried to narrow the frame by providing the curvature part as apart of the display device. Note that on an inner peripheral surface side of the film-like base material, a protection sheet that protects the base material is provided.

SUMMARY OF THE INVENTION

However, regarding conventional display devices, there is a fear that when forming the curvature part of the conventional display devices, a bending stress is concentrated onto a border region between a protection sheet formation part and a protection sheet non-formation part to damage the wiring.

One or more embodiments of the present disclosure have been made in view of the above problem, and the object thereof is to alleviate a damage to a wiring of a display device when forming a curvature part.

(1) A display device according to one or more embodiments of the present invention includes: a display panel including a display region, a backside region that is opposed to at least a part of the display region, and a curvature region that connects the display region and the backside region, wherein the display panel comprises: an insulating base material disposed on the display region, the curvature region, and the backside region; a wiring layer that is disposed on an outer surface side of the insulating base material, and comprises an insulating layer and a wiring; a display element that is provided on an outer surface side of the wiring layer in the display region, and is electrically connected to the wiring; and a first protection sheet that is provided on an inner surface side of the insulating base material in the display region, and includes a plurality of projection parts that protrude toward a side of the curvature region from a side of the display region.

(2) In the display device as described in (1) above, shapes of the plurality of projection parts of the first protection sheet are almost triangular shapes whose apexes are rounded.

(3) In the display device as described in (1) above, the display panel further comprises: a driver IC provided on an outer surface side of the wiring layer in the backside region; and a signal line that connects the display element and the driver IC, and the signal line is disposed on an outer surface side of the insulating base material at a position corresponding to somewhere between apexes of two neighboring projection parts from among the plurality of projection parts of the first protection sheet.

(4) In the display device as described in (1) above, the display panel further comprises: a driver IC provided on an outer surface side of the wiring layer in the backside region; a signal line that connects the display element and the driver IC; and an electric power source line that supplies electric power to the display element, wherein a distribution density of the plurality of projection parts of the first protection sheet is not uniform, the signal line is disposed at a position corresponding to a region where the distribution density of the plurality of projection parts is high, and the electric power source line is disposed at a position corresponding to a region where the distribution density of the plurality of projection parts is low.

(5) In the display device as described in (4) above, on the first protection sheet the region where the distribution density of the plurality of projection parts is low is farther from a central part of the first protection sheet than the region where the distribution density of the plurality of projection parts is high.

(6) In the display device as described in (1) above, a thickness of the first protection sheet becomes thinner as it extends from a side of the display region to a side of the curvature region.

(7) In the display device as described in (1) above, the display panel further comprises a third protection sheet that is disposed at least on an outer peripheral side of the curvature region, and a part of the third protection sheet and a part of the first protection sheet are opposed to each other with an interposition of the insulating base material and the wiring layer.

(8) In the display device as described in (1) above, an intersection angle of one of the plurality of projection parts that the first protection sheet includes and an edge of the insulating base material is an obtuse angle.

(9) In the display device as described in (1) above, the display panel further comprises a second protection sheet that is disposed on an inner surface side of the insulating base material in the backside region and includes a plurality of projection parts that protrude from a side of the backside region toward a side of the curvature region.

(10) In the display device as described in (9) above, at least one of apexes of the plurality of projection parts of the first protection sheet and at least one of apexes of the plurality of projection parts of the second protection sheet are opposed to each other.

(11) In the display device as described in (9) above, the display panel further comprises: a driver IC provided on an outer surface side of the wiring layer in the backside region; and a signal line that connects the display element and the driver IC, and the signal line extends on an outer surface side of the insulating base material from a position corresponding to a side of one of the projection parts having triangular shapes of the first protection sheet to a position corresponding to a side of one of the projection parts having triangular shapes of the second protection sheet.

(12) In the display device as described in (9) above, the signal line is disposed on an outer surface side of the insulating base material at a position corresponding to somewhere between apexes of two neighboring projection parts from among the plurality of projection parts of the second protection sheet.

(13) In the display device as described in (9) above, the display panel further comprises: a driver IC provided on an outer surface side of the wiring layer in the backside region; a signal line that connects the display element and the driver IC; and an electric power source line that supplies electric power to the display element, and in a distribution density of the plurality of projection parts of the second protection sheet is not uniform, the signal line is disposed at a position corresponding to a region where the distribution density of the plurality of projection parts is high, and the electric power source line is disposed at a position corresponding to a region where the distribution density of the plurality of projection parts is low.

(14) In the display device as described in (13) above, on the second protection sheet the region where the distribution density of the plurality of projection parts is low is farther from a central part of the second protection sheet than the region where the distribution density of the plurality of projection parts is high.

(15) In the display device as described in (9) above, a thickness of the second protection sheet becomes thinner as it extends from a side of the backside region side to a side of the curvature region.

(16) In the display device as described in (9) above, the display panel further comprises a third protection sheet that is disposed at least on an outer peripheral side of the curvature region, and a part of the third protection sheet and a part of the second protection sheet are opposed to each other with an interposition of the insulating base material and the wiring layer.

(17) In the display device as described in (9) above, an intersection angle of one of the plurality of projection parts that the second protection sheet includes and an edge of the insulating base material is an obtuse angle.

DETAILED DESCRIPTION OF THE INVENTION

First Embodiment

Figure 1:
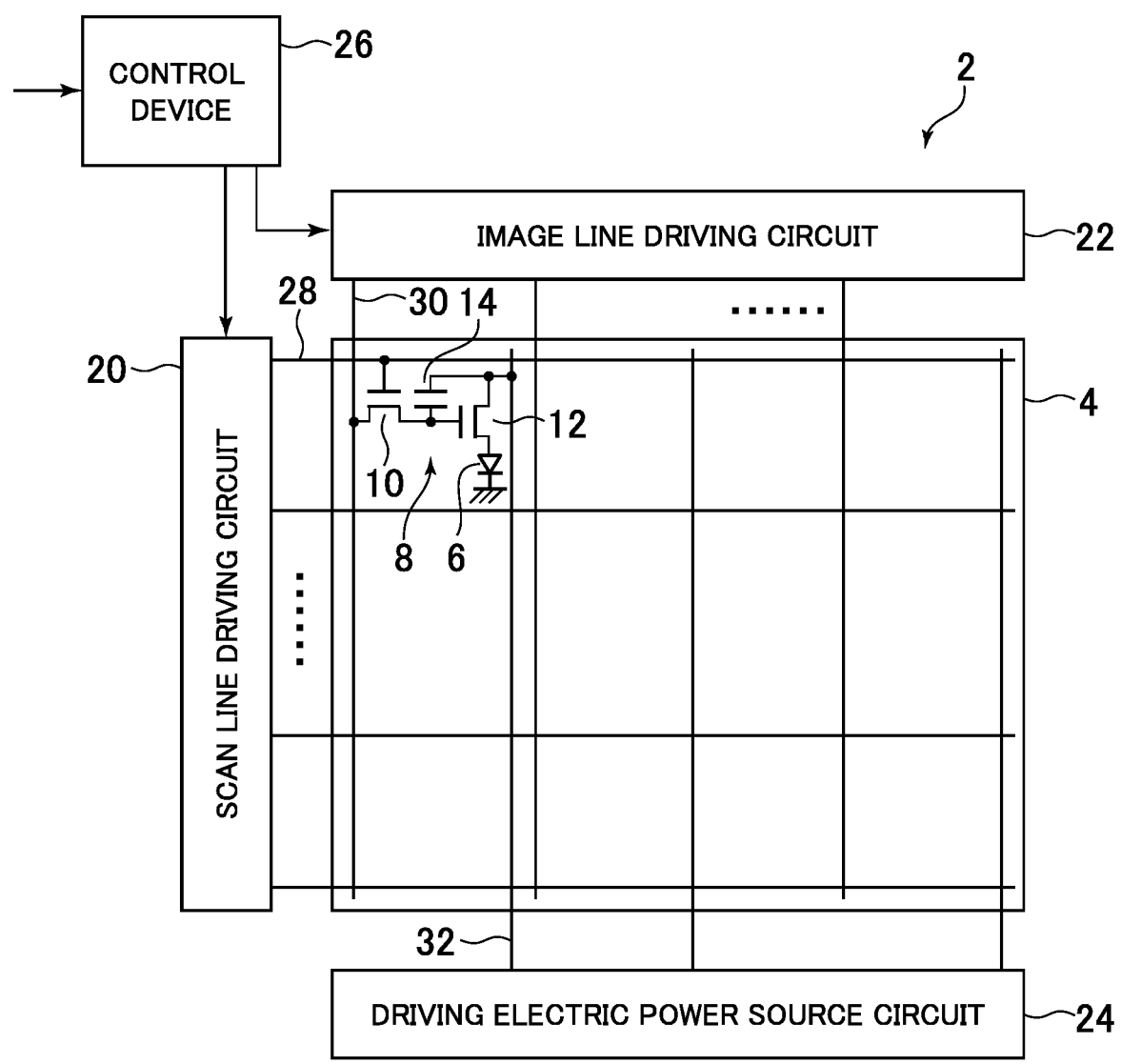
FIG. 1 is a schematic diagram illustrating a schematic configuration of a display device according to a present embodiment.

Below, one or more embodiments of the present disclosure are explained with reference to the accompanying drawings.

Note that the present disclosure is merely an example, and a variation that a person skilled in the art can easily arrive at without departing from the spirit of the present invention is naturally included in the scope of the present invention. Further, while the width, thickness, shape, and the like of each part in the drawings may be illustrated schematically as compared with actual embodiments in order to clarify the explanation, these are merely examples and an interpretation of the present invention should not be limited thereto. Furthermore, in the specification and respective drawings, the same reference symbols may be applied to elements similar to those that have already been illustrated in another drawing and a detailed explanation of such elements may be omitted as appropriate.

A display device 2 according to an embodiment of the present disclosure is, for example, an organic electroluminescent display device, and is mounted on a television, a personal computer, a mobile terminal, a cellular phone, and the like. FIG. 1 is a schematic diagram illustrating a schematic configuration of the display device 2 according to the present embodiment. The display device 2 is provided with a pixel array part 4 that displays an image, and a driving part that drives the pixel array part 4. The display device 2 is a flexible display, and includes a base material formed of a resin film or the like having flexibility, and a wiring layer including a wiring provided inside or over the base material.

On the pixel array part 4 an organic light emitting diode 6 and a pixel circuit 8 are arranged in a matrix form in correspondence with a pixel. The pixel circuit 8 includes a lighting TFT (thin film transistor) 10, a driving TFT 12, a capacitor 14, and the like.

Meanwhile, the driving part includes a scan line driving circuit 20, an image line driving circuit 22, a driving electric power source circuit 24, and a control device 26, drives the pixel circuit 8, and controls lighting of the organic light emitting diode 6.

The scan line driving circuit 20 is connected to a scan signal line 28 provided for each horizontal sequence of pixels (a pixel row). The scan line driving circuit 20 selects the scan signal line 28 in order in accordance with a timing signal input from the control device 26, and applies an electric voltage for turning on the lighting TFT 10 to the selected scan signal line 28.

The image line driving circuit 22 is connected to an image signal line 30 provided for each vertical sequence of pixels (a pixel column). The image line driving circuit 22 receives an input of an image signal from the control device 26, and outputs, in accordance with the selection of the scan signal line 28 by the scan line driving circuit 20, an electric voltage in accordance with the image signal of the selected pixel row to each image signal line 30. The electric voltage is written into the capacitor 14 via the lighting TFT 10 in the selected pixel row. The driving TFT 12 supplies an electric current in accordance with the electric voltage written therein to the organic light emitting diode 6. This way, the organic light emitting diode 6 of a pixel corresponding to the selected scan signal line 28 emits light.

The driving electric source circuit 24 is connected to the driving electric source line 32 provided for each pixel column, and supplies an electric current to the organic light emitting diode 6 via a driving electric source line 32 and the driving TFT 12 of the selected pixel row.

Here, a lower electrode of the organic light emitting diode 6 is connected to the driving TFT 12. Meanwhile, an upper electrode of each organic light emitting diode 6 is constituted by an electrode shared by the organic light emitting diodes 6 of all the pixels. In a case where the lower electrode is configured as an anode, a high electric potential is input thereto, and the upper electrode becomes a cathode and a low electric potential is input thereto. In a case where the lower electrode is configured as a cathode, a low electric potential is input thereto, the upper electrode becomes an anode and a high electric potential is input thereto.

Figure 2:
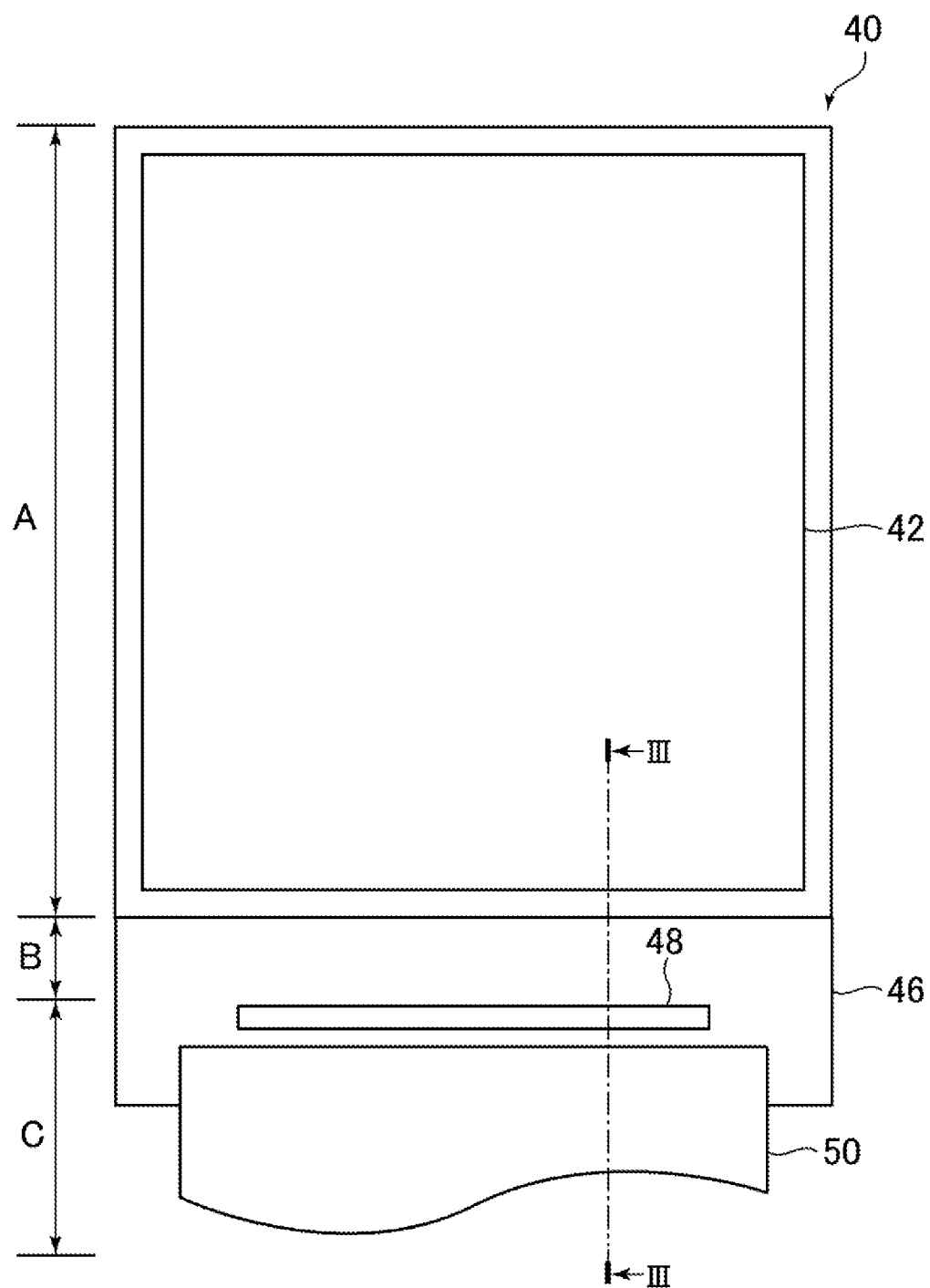
FIG. 2 is a schematic planar diagram of a display panel of a display device according to the present embodiment.

FIG. 2 is a schematic planar diagram of the display panel 40 on the display device 2. The display panel 40 includes a display region A, a curvature region B that is connected to the display region A, and a backside region C that is connected to the curvature region B.

On the display region A of the display panel 40, a display element 42 is disposed, and the display element 42 includes the pixel array part 4 the organic light emitting diode 6, and the pixel circuit 8 that are illustrated in FIG. 1.

On the curvature region B and the backside region C of the display panel 40, a component mounting region 46 is provided and a wiring that is electrically connected to the display element 42 is disposed. Further, a driver IC 48 that constitutes the driving part is mounted on the component mounting region 46, and an FPC (Flexible Printed Circuit) 50 is connected to the component mounting region 46. The FPC 50 is connected to the control device 26, the scan line driving circuit 20, the image line driving circuit 22, the driving electric power source circuit 24, and the like, and an IC is mounted on the FPC 50.

When the display panel 40 is put in a housing of the display device 2, the curvature region B is bent backward to thereby arrange the backside region C opposed to the backside of the display region A, and the backside region C is opposed to at least a part of the display region A.

Figure 3:
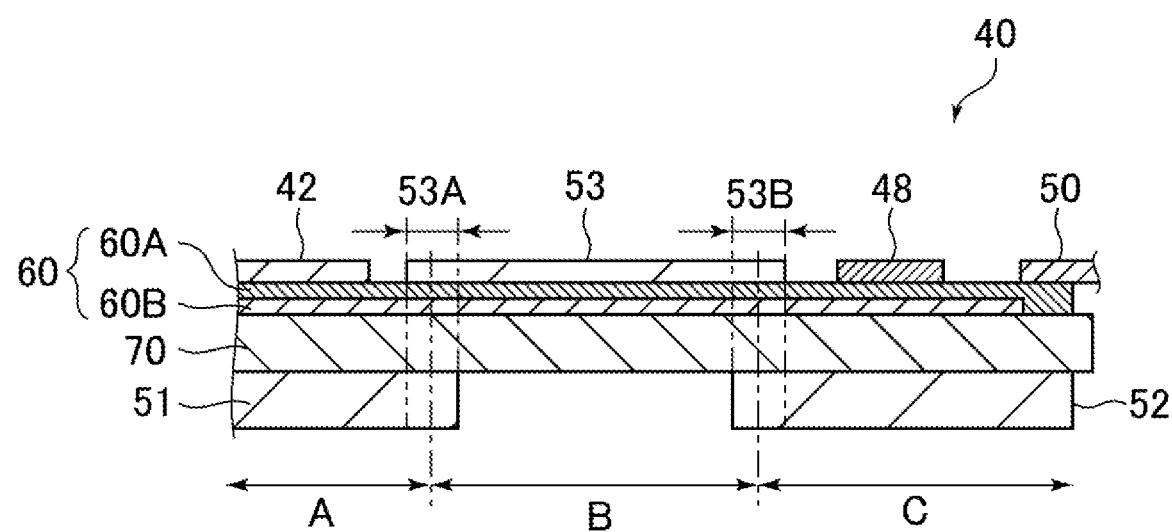
FIG. 3 is a schematic perpendicular cross-sectional diagram of a display panel of a display device according to the present embodiment.

FIG. 3 is a cross-sectional diagram illustrating a cross section at III-III line in FIG. 2. As described above with reference to FIG. 2, the display panel 40 includes the display region A, the curvature region B, and the backside region C. When bending the curvature region B, it is bent so that the lower surface side of the backside region C of the display panel 40 is opposed to the lower surface side of the display region A. Here, the surface of the display region A that is opposed to the backside region C is defined as an inner surface of the display region A, and the surface of the backside region C that is opposed to the display region A is defined as an inner surface of the backside region C. Further, the surface of the curvature region B that faces toward the center of the entire display panel 40 is defined as an inner surface of the curvature region B.

The display panel 40 includes an insulating base material 70 arranged over the display region A, the curvature region B, and the backside region C. The insulating base material 70 is formed of insulating resin or the like such as polyimide.

On the outer surface side of the insulating base material 70, the wiring layer 60 is disposed. The wiring layer 60 includes an insulating layer 60A, and the wiring 60B covered by this insulating layer 60A. The insulating layer 60A is formed of, for example, silicon nitride, silicon oxide, or the like.

On the outer surface side of the wiring layer 60 in the display region A, the display element 42 described above is provided, and it is electrically connected to the wiring 60B in the wiring layer 60.

Figure 4:
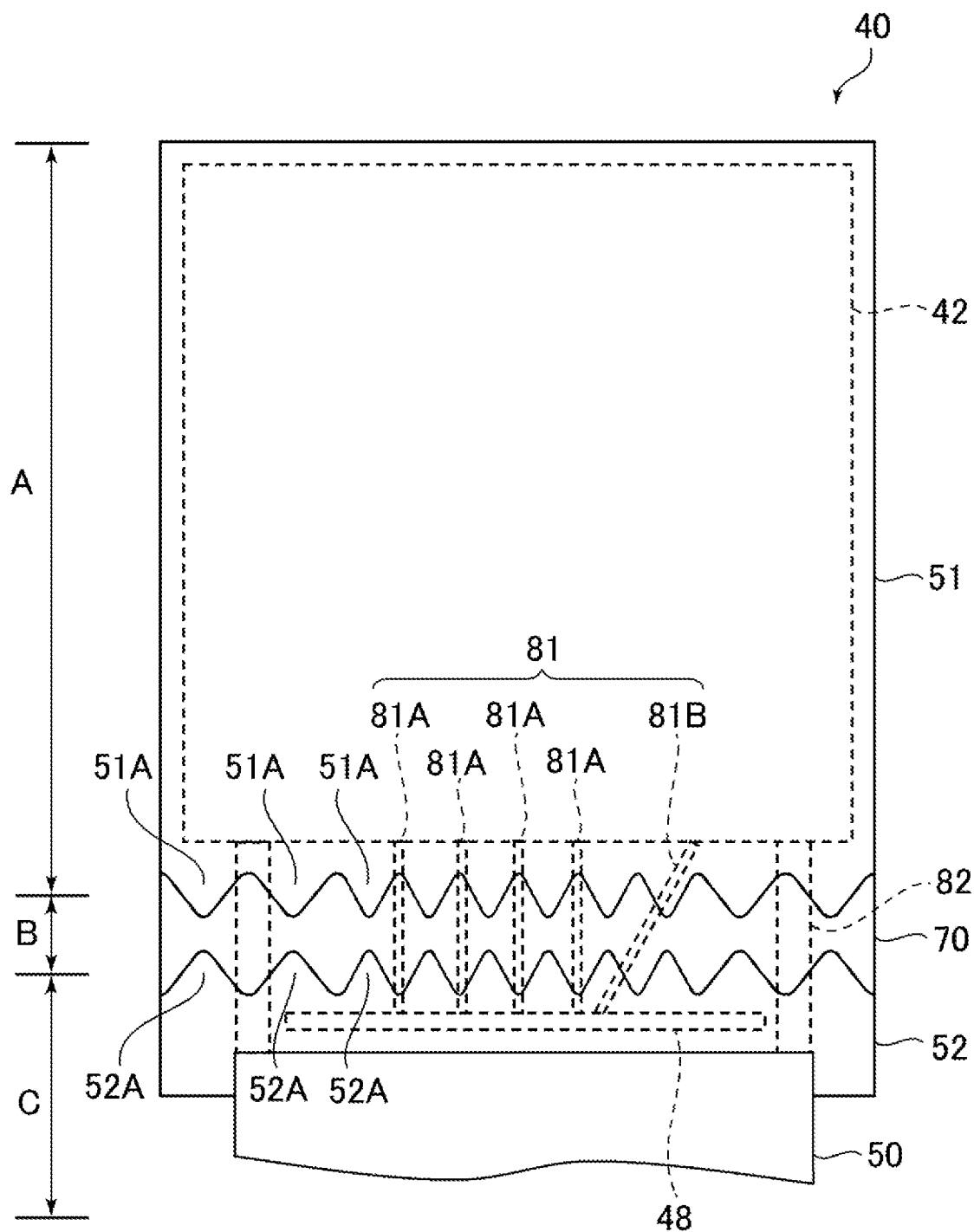
FIG. 4 is a schematic planar diagram illustrating an inner surface side of a display panel of a display device according to the present embodiment.

On the outer surface side of the wiring layer 60 in the backside region C, the driver IC 48, and the FPC 50 described above are provided. Between the display element 42 and the driver IC 48, a signal line 81 illustrated in FIG. 4 is disposed, and is used as a signal transmission path between them. The signal line 81 is provided on the outer surface side of the insulating base material 70. It may be disposed on the upper surface of the wiring layer 60, and may be included in the wiring 60B in the wiring layer 60. Between the display element 42 and the FPC 50, an electric power source line 82 illustrated in FIG. 4 is disposed, which supplies electric power to the display element 42. This electric power source line 82 also is provided on the outer surface side of the insulating base material 70. It may be arranged over the wiring layer 60, and may be included in the wiring 60B in the wiring layer 60.

On the inner surface side of the insulating base material 70 in the display region A, a first protection sheet 51 is disposed. As the first protection sheet 51, for example, photosensitive acrylic resin, silicone, polyethylene terephthalate, or the like can be used.

On the inner surface side of the insulating base material 70 in the display region C, a second protection sheet 52 is disposed. As the second protection sheet 52, for example, photosensitive acrylic resin, silicone, polyethylene terephthalate, or the like can be used, as in the case of the first protection sheet 51.

On the outer surface side of the wiring layer 60 in the curvature region B, a third protection sheet 53 is disposed. As the third protection sheet 53, for example, an organic protection sheet such as polyimide can be used. By disposing this third protection sheet 53, a damage from the outer surface side to the wiring 60B in the wiring layer 60 can be alleviated, and moreover cracking of the insulating layer 60A can be suppressed as well. Note that in a border part between the display region A and the curvature region B, an overlap region 53A is provided where a part of this third protection sheet 53 and a part of the first protection sheet 51 are opposed to each other with an interposition of the insulating base material 70 and the like. Further, in a border part between the backside region C and the curvature region B, an overlap region 53B is provided where a part of this third protection sheet 53 and a part of the second protection sheet 52 are opposed to each other with an interposition of the insulating base material 70 and the like.

Subsequently, shapes of the first protection sheet 51 and the second protection sheet 52 are explained.

FIG. 4 is a schematic planar diagram illustrating the inner surface side of the display panel according to the present embodiment.

The first protection sheet 51 provided on the inner surface side of the display region A includes a plurality of projection parts 51A that project toward the curvature region B side from the display region A side. Further, the second protection sheet 52 provided on the inner surface side of the display region C includes a plurality of projection parts 52A that project toward the curvature region B side from the backside region C side. In the present embodiment, the plurality of projection parts 51A of the first protection sheet 51 and the plurality of projection parts 52A of the second protection sheet 52 have almost triangular shapes whose apexes are rounded.

Due to the configuration as above, it is possible to disperse, on sides of the plurality of projection parts 51A of the first protection sheet 51, the bending stress in the border region between the display region A and the curvature region B at the time of bending the curvature region B. Further, it is possible to disperse, on sides of the plurality of projection parts 52A of the second protection sheet 52, the bending stress in the border region between the backside region C and the curvature region B. As a result, a damage to the wiring 60B of the wiring layer 60 illustrated in FIG. 3 can be alleviated.

Figure 5:
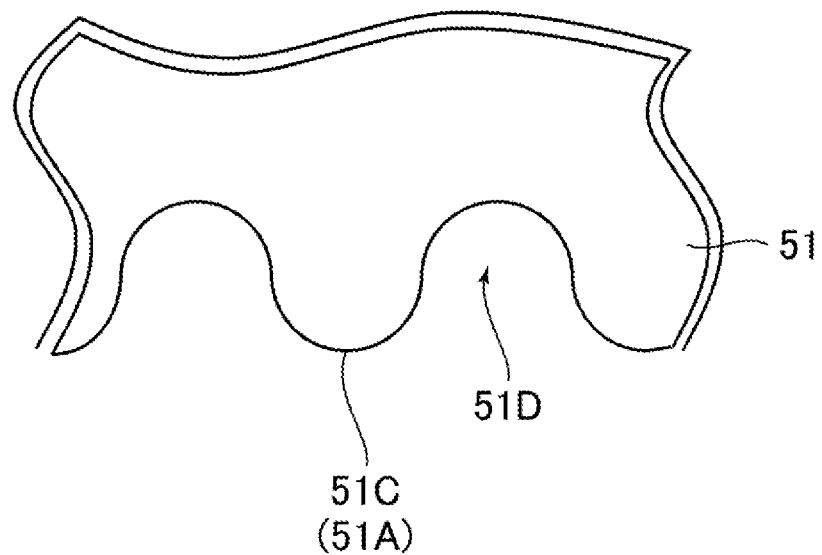
FIG. 5 is a schematic diagram illustrating a shape of a projection part of a first protection sheet of a display device according to the present embodiment.
Figure 6:
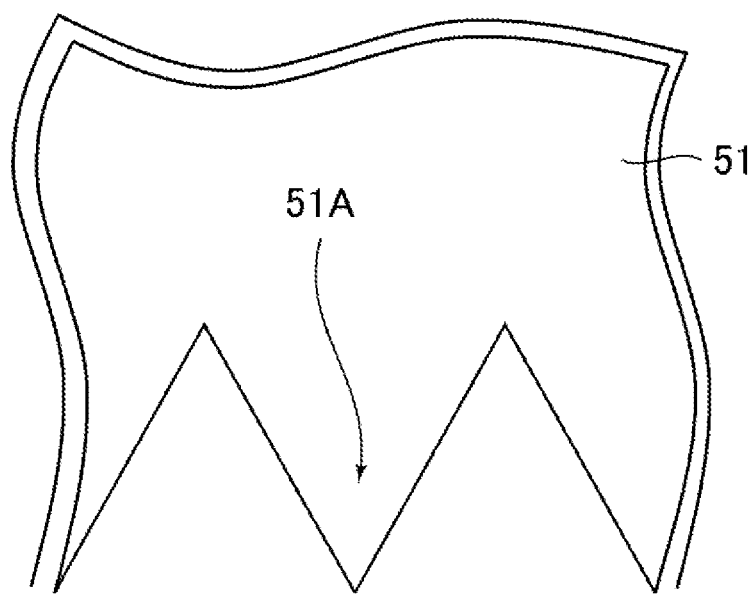
FIG. 6 is a schematic diagram illustrating a shape of a projection part of a first protection sheet of a display device according to the present embodiment.

Shapes of the plurality of projection parts 51A and the plurality of projection parts 52A are not limited to the almost triangular shapes described above whose apexes are rounded, but may be a shape formed by combining the projection part 51C having a semi-circular shape and a recessed part 51D having a semi-circular shape as illustrated in FIG. 5, or a triangular shape that is not rounded as illustrated in FIG. 6. With the shape in FIG. 5 formed by combining the projection part 51C having a semi-circular shape and the recessed part 51D having a semi-circular shape, since the apex of the projection part 51C is not pointed, the first protection sheet 51 and the second protection sheet 52 can be configured to be hardly peeled off from the insulating base material 70. Further, with the triangular shape that is not rounded as illustrated in FIG. 6, a flexibility of the projection part 51A constantly changes starting from its apex to the its base, the flexibility does not suddenly change at one point, and it is configured to alleviate the damage to the wiring 60B in the wiring layer 60 as described above. Note that the effect described above that the first protection sheet 51 and the second protection sheet 52 can be hardly peeled off from the insulating base material 70 by forming them to have the almost triangular shapes with the rounded apexes as illustrated in FIG. 4 and the effect described above that the damage to the wiring 60B in the wiring layer 60 is alleviated can be attained at the same time.

Note that it is preferable to configure an intersection angle of one of the plurality of projection parts 51A that the first protection sheet 51 includes and an edge of the insulating base material 70 to be an obtuse angle. Due to the configuration as above, the effect can be attained that the first protection sheet 51 is hardly peeled off from an edge side of the insulating base material 70. Similarly, it is preferable to configure an intersection angle of one of the plurality of projection parts 52A that the second protection sheet 52 includes and an edge of the insulating base material 70 to be an obtuse angle.

Subsequently, a positional relationship of the first protection sheet 51, the second protection sheet 52, the signal line 81, and the electric power source line 82 is explained.

On the outer surface side of the insulating base material 70, the plurality of signal lines 81 that connect the display element 42 and the driver IC 48 are provided as described above. In the present embodiment, as illustrated in FIG. 4, it is configured that the apexes of the plurality of projection parts 51A of the first protection sheet 51 and the apexes of the plurality of projection parts 52A of the second protection sheet 52 are opposed to each other. Therefore, when one of the ends of the signal line 81A that extends in the long side direction of the insulating base material 70 is disposed at a position that corresponds to somewhere between apexes of two neighboring projection parts 51A from among the plurality of projection parts 51A of the first protection sheet 51, the other one of the ends of the signal line 81A is disposed at a position that corresponds to somewhere between apexes of two neighboring projection parts 52A from among the plurality of projection parts 52A of the second protection sheet 52. Due to the configuration as above, when forming the curvature region B, damages to the signal line 81A from the apexes of the plurality of projection parts 51A and the plurality of projection parts 52A can be suppressed.

Further, from among the plurality of signal lines 81, a signal line 81B that extends in an oblique direction from the display element 42 to the driver IC 48 is configured to extend from a position that corresponds to a side of the projection part 51A having a triangular shape of the first protection sheet 51 to a position that corresponds to a side of the projection part 52A having a triangular shape of the second protection sheet 52. Due to the configuration as above, when forming the curvature region B, damages to the signal line 81B from the apexes of the plurality of projection parts 51A and the plurality of projection parts 52A can be suppressed.

In the present embodiment, as illustrated in FIG. 4, a distribution density of the plurality of projection parts 51A and the plurality of projection parts 52A is not uniform, and a distribution density of the projection parts 51A and the projection parts 52A that are close to an edge of the insulating base material 70 is lower than that of the projection parts 51A and the projection parts 52A that are at a central part of the insulating base material 70. Further, the electric power source line 82 that generally has a width larger than that of the signal line 81 is close to an edge of the insulating base material 70. Due to the configuration as above, the electric power source line 82 that has a width larger than that of the signal line 81 can be disposed between apexes of two neighboring projection parts 51A and between apexes of two neighboring projection parts 52A in a region where the distribution density of the projection parts 51A and the projection parts 52A is low, and the signal line 81 a number of which is large and which has a small width can be disposed between apexes of two neighboring projection parts 51A and between apexes of two neighboring projection parts 52A in a region where the distribution density of the projection parts 51A and the projection parts 52A is high.

Figure 7:
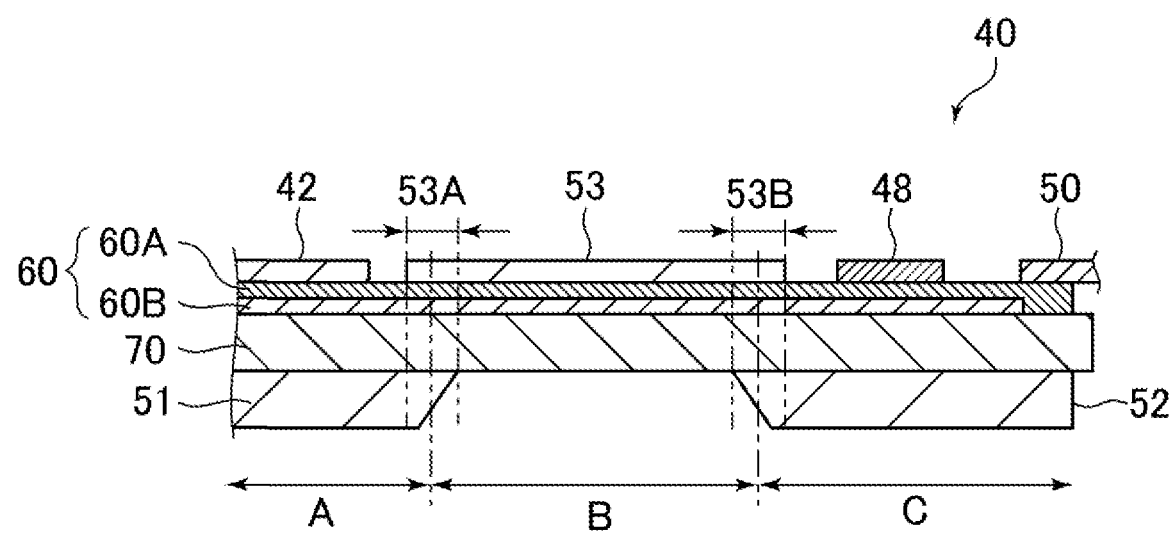
FIG. 7 is a schematic perpendicular cross-sectional diagram of a display panel of a display device according to the present embodiment.

Note that due to the configuration as illustrated in FIG. 7 that a thickness of the first protection sheet 51 becomes thinner as it extends from the display region A side to the curvature region B side, and a thickness of the second protection sheet 52 becomes thinner as it extends from the backside region C side to the curvature region B side, the flexibility of the insulating base material 70 can be changed continuously, and the effect of suppressing the damages to the wiring 60B in the wiring layer 60 as described above can be enhanced.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   an insulating base material;
   a plurality of pixels on a first surface of the insulating base material;
   a plurality of signal lines on the first surface of the insulating base material; and
   a protection sheet on a second surface of the insulating base material, wherein
   the display device includes a display region which includes the plurality of pixels, a backside region which includes the edge of the insulating base material, and a curvature region between the display region and the backside region, the plurality of signal lines extend from the display region toward an edge of the insulating base material, the curvature region includes a region where the second surface is not covered with the protection film, the plurality of signal lines include a first signal line and a second signal line, the first signal line and the second signal line are arranged in parallel each other, an edge of the protection film at the region intersects the first signal line and the second signal line, an angle between the first signal line and a part of the edge of the protection film at the region is not perpendicular, and an angle between the second signal line and a part of the edge of the protection film at the region is not perpendicular.

2. The display device according to claim 1, wherein the part of the edge of the protection film at the region which intersects the first signal line and the part of the edge of the protection film at the region which intersects the second signal line are not in parallel to each other.

3. The display device according to claim 1, further comprising a driver IC on the first surface of the insulating base material, wherein the region is between the display element and the driver IC, and each of the plurality of signal lines is electrically connected to the driver IC.

4. The display device according to claim 1, wherein the protection sheet is divided into a first protection sheet and a second protection sheet by the region.

5. The display device according to claim 4, further comprising a third protection sheet on the first surface of the insulating base material, wherein the third protection sheet overlaps with both of the first protection sheet and the second protection sheet in a planar view.

* * * * *